(12) United States Patent
Lai et al.

(10) Patent No.: US 8,848,326 B2
(45) Date of Patent: Sep. 30, 2014

(54) CROSS-DOMAIN ESD PROTECTION SCHEME

(75) Inventors: Da-Wei Lai, Singapore (SG); Ying-Chang Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 288 days.

(21) Appl. No.: 13/415,970

(22) Filed: Mar. 9, 2012

(65) Prior Publication Data

US 2013/0235498 A1 Sep. 12, 2013

(51) Int. Cl.
*H02H 9/00* (2006.01)

(52) U.S. Cl.
USPC .......................................................... 361/56

(58) Field of Classification Search
CPC ...................................................... H02H 9/046
USPC .......................................................... 361/56
See application file for complete search history.

(56) References Cited

U.S. PATENT DOCUMENTS 7,280,328 B2 * 10/2007 Arai et al. ........................ 361/56
7,817,386 B2 * 10/2010 Ker et al. ......................... 361/56

* cited by examiner

*Primary Examiner* — Jared Fureman
*Assistant Examiner* — Tien Mai
(74) *Attorney, Agent, or Firm* — Ditthavong & Steiner, P.C.

(57) ABSTRACT

A cross-domain ESD protection scheme is disclosed. Embodiments include coupling a first power clamp to a first power rail and a first ground rail; providing a first NMOS transistor having a first source, a first drain, and a first gate; coupling the first source to a second ground rail; providing a first PMOS transistor having a second source, a second drain, and a second gate; coupling the second source to the first power rail; and providing, via the first power clamp, a signal to turn on the first NMOS transistor during an ESD event that occurs at the first power rail.

15 Claims, 5 Drawing Sheets

CROSS-DOMAIN ESD PROTECTION SCHEME

TECHNICAL FIELD

The present disclosure relates to cross-domain circuits. The present disclosure is particularly applicable to cross-domain interface circuits in 28 nanometer (nm) technology nodes and beyond.

BACKGROUND

Generally, integrated circuits will include multiple power domains. A device may, for instance, include an input/output (I/O) circuit along with a core circuit, each of which may be associated with a different power domain (e.g., the I/O circuit may be associated with a high voltage power domain, the core circuit may be associated with a low voltage power domain, etc.). Thus, signals may travel from a high voltage power domain to a low voltage power domain. Typically, from an electrostatic discharge (ESD) protection design point-of-view, one of the most critical issues of cross-domain interface circuits is gate oxide breakdown of low-voltage metal-oxide-semiconductor field-effect transistors (MOSFETs). In addition, the overall gate oxide breakdown voltage ($V_{BD}$) is decreasing in advancing technology. As such, any margin, for instance, between $Vt_1$ (e.g., trigger voltage) of ESD grounded gate n-type MOS (ggNMOS) and $V_{BD}$ of MOSFET gate oxide is practically non-existent.

FIG. 1 schematically illustrates a circuit that includes a traditional cross-domain ESD protection scheme. As shown, the circuit in FIG. 1 includes an I/O input terminal 101 connected to transistors 103 and 105, the drains of which are connected to the gates of transistors 107 and 109. Moreover, the circuit includes design paths 111a (e.g., from power rail 113 to ground rail 115 through clamp 117, ground rail 119, and diode 121) and 111b (e.g., from power rail 113 to power rail 123 through clamp 117, ground rail 119, diode 121, ground rail 115, and a parasitic diode of clamp 125) to enable ESD current to travel, for instance, from VDD1 to VSS2 and VDD1 to VDD2. Nonetheless, some ESD current may also travel along path 127 through transistor 103 to damage the gate oxide of transistor 109 (e.g., under VDD1 to VSS2 ESD zapping), and along path 129 through transistor 103 to damage the gate oxide of transistor 107 (e.g., under VDD1 to VDD2 ESD zapping).

FIG. 2 schematically illustrates a typical solution for the problems of a traditional cross-domain ESD protection scheme. As shown, the circuit in FIG. 2 includes components similar to the components of the circuit in FIG. 1, such as transistors 201, 203, 205, and 207, power rails 209 and 211 (e.g., VDD1 and VDD2), ground rails 213 and 215 (e.g., VSS1 and VSS2), clamps 217 and 219, and diodes 221. To overcome some of the issues associated with the traditional cross-domain ESD protection scheme, the circuit in FIG. 2 further includes resistor 223, diode 225, and transistor 227 (e.g., grounded gate transistor). Resistor 223 reduces the voltage drop between the respective gate and source of transistors 205 and 207, decreasing the likelihood of gate oxide damage to transistors 205 and 207 as a result of an ESD event (e.g., ESD zapping). Diode 225 protects transistor 205 (e.g., PMOS transistor) from gate oxide breakdown during an ESD event from power rail 209 to power rail 211 (e.g., VDD1 to VDD2 ESD zapping). Transistor 227 protects transistor 207 (e.g., NMOS transistor) from gate oxide breakdown during an ESD event from power rail 209 to ground rail 215 (e.g., VDD1 to VSS2 ESD zapping).

Nonetheless, although the ESD protection scheme of FIG. 2 may increase gate-oxide protection in mature technologies, the scheme still has several drawbacks. For example, although resistor 223 reduces the voltage drop between the respective gate and source of the transistors 205 and 207, the inclusion of resistor 223 in the circuit negatively impacts high-speed I/O application. In addition, leakage may occur through diode 225 during normal operations (e.g., leakage may occur when VDD1 is powered on before VDD2 is powered on). While a power-on sequence may be implemented to mitigate leakage, such a solution hinders flexibility associated with the circuit. Furthermore, while the addition of transistor 227 may protect transistor 207 from gate oxide breakdown in mature technologies, such an approach will not be effective in advanced technologies, since any margin, for instance, between $Vt_1$ of transistor 227 and $V_{BD}$ of the gate oxide of transistor 207 will practically be non-existent.

FIG. 3 schematically illustrates another solution for the problems of a traditional cross-domain ESD protection scheme. As shown, the circuit in FIG. 3 includes components similar to the components of the circuit in FIG. 1, such as transistors 301, 303, 305, and 307, power rails 309 and 311 (e.g., VDD1 and VDD2), ground rails 313 and 315 (e.g., VSS1 and VSS2), clamps 317 and 319, and diodes 321. To overcome some of the issues associated with the ESD protection schemes of FIGS. 1 and 2, the circuit in FIG. 3 includes resistors 323, 325, and 327, transistors 329 and 331, and source pump resistors 333 and 335. The addition of source pump resistors 333 and 335, for instance, further reduces the potential difference between the respective gate and source of the transistors 305 and 307, while the structure including resistor 327 and transistor 329 eliminates the need for a power-on sequence.

However, the ESD protection scheme of FIG. 3 also has several drawbacks. For example, as shown by indicator 337, transistor 331 may suffer false-triggering as a result of a noisy I/O ground rail 313 (e.g., simultaneous switching output and simultaneous switching noise (SSO/SSN)), resulting in distortion of the core output function. Moreover, the inclusion of source pump resistors 333 and 335 further reduces the speed of high-speed I/O applications and increases the design complexity of the circuit. In addition, the increase in the number of resistors (e.g., resistors 323, 325, and 327, and source pump resistors 333 and 335) results in more chip area required to implement the design, increasing the size of devices associated with such designs.

A need therefore exists for circuits with more effective ESD solutions, for instance, that complement high-speed I/O applications with minimal impact on device size, and enabling methodology.

SUMMARY

An aspect of the present disclosure is a circuit implementing a cross-domain ESD protection scheme for advanced technologies.

Another aspect of the present disclosure is a method for implementing a cross-domain protection scheme for advanced technologies.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a first power clamp coupled to a first power rail and a first ground rail; a first NMOS transistor having a first source, a first drain, and a first gate, wherein the first source is coupled to a second ground rail; and a first PMOS transistor having a second source, a second drain, and a second gate, wherein the second source is coupled to the first power rail, and the first power clamp provides a signal to turn on the first NMOS transistor during an ESD event that occurs at the first power rail.

Aspects include a circuit having the first gate coupled to the first power clamp, the second drain coupled to the first drain, wherein an ESD path from the first PMOS transistor to the second ground rail through the first NMOS transistor is provided during the ESD event. Some aspects include a circuit having a second power clamp coupled to a second power rail and the second ground rail, wherein an ESD path from the first PMOS transistor to the second power rail through the first NMOS transistor and the second power clamp is provided during the ESD event.

Additional aspects include a circuit having a second NMOS transistor having a third source, a third drain, a third gate, and a body, wherein the body is coupled to the second ground rail, and the second NMOS transistor is turned on during the ESD event. Further aspects include the third source being coupled to the second drain, the third drain being coupled to a second power rail, and a second PMOS transistor having a fourth source, a fourth drain, and a fourth gate, wherein the fourth source is coupled to the first ground rail, the fourth drain is coupled to the third gate, and the fourth gate is coupled to the second ground rail. Another aspect includes an ESD path from the first PMOS transistor to the second power rail through the second NMOS transistor being provided during the ESD event.

Further aspects include a circuit having a third NMOS transistor having a fifth source, a fifth drain, and a fifth gate, wherein the fifth source is coupled to the first source; and a third PMOS transistor having a sixth source, a sixth drain, and a sixth gate, wherein the sixth source is coupled to the second power rail, the sixth drain is coupled to the fifth drain, and the sixth gate is coupled to the second drain and the fifth gate. Other aspects include a circuit having the first power clamp include a resistor coupled to the first power rail; a capacitor coupled to the resistor and the first ground rail; and an inverter having an input terminal coupled to the resistor and the capacitor, and an output terminal coupled to the first gate.

An additional aspect of the present disclosure is a method including: coupling a first power clamp to a first power rail and a first ground rail; providing a first NMOS transistor having a first source, a first drain, and a first gate; coupling the first source to a second ground rail; providing a first PMOS transistor having a second source, a second drain, and a second gate; coupling the second source to the first power rail; and providing, via the first power clamp, a signal to turn on the first NMOS transistor during an ESD event that occurs at the first power rail.

Some aspects include: coupling the first gate to the first power clamp; and coupling the second drain to the first drain, wherein an ESD path from the first PMOS transistor to the second ground rail through the first NMOS transistor is provided during the ESD event. Other aspects include: coupling a second power clamp to a second power rail and the second ground rail, wherein an ESD path from the first PMOS transistor to the second power rail through the first NMOS transistor and the second power clamp is provided during the ESD event.

Certain aspects include: providing a second NMOS transistor having a third source, a third drain, a third gate, and a body; and coupling the body to the second ground rail, wherein the second NMOS transistor is turned on during the ESD event. Additional aspects include: coupling the third source to the second drain; coupling the third drain to a second power rail; providing a second PMOS transistor having a fourth source, a fourth drain, and a fourth gate; coupling the fourth source to the first ground rail; coupling the fourth drain to the third gate; and coupling the fourth gate to the second ground rail. Another aspect includes an ESD path from the first PMOS transistor to the second power rail through the second NMOS transistor being provided during the ESD event.

Various aspects include: providing a third NMOS transistor having a fifth source, a fifth drain, and a fifth gate; coupling the fifth source to the first source; providing a third PMOS transistor having a sixth source, a sixth drain, and a sixth gate; coupling the sixth source to the second power rail; coupling the sixth drain to the fifth drain; and coupling the sixth gate to the second drain and the fifth gate. Further aspects include: providing a resistor coupled to the first power rail; providing a capacitor coupled to the resistor and the first ground rail; and providing an inverter having an input terminal coupled to the resistor and the capacitor, and an output terminal coupled to the first gate.

Another aspect of the present disclosure is a circuit including: a first power clamp coupled to a first power rail and a first ground rail; a first NMOS transistor having a first source, a first drain, and a first gate; and a first PMOS transistor having a second source, a second drain, and a second gate, wherein the first source is coupled to a second ground rail, and the first gate is coupled to the first power clamp, the second source is coupled to the first power rail, and the second drain is coupled to the first drain, and wherein the first power clamp provides a signal to turn on the first NMOS transistor during a cross-domain ESD event that occurs at the first power rail, and a first ESD path from the first PMOS transistor to the second ground rail through the first NMOS transistor is provided during the cross-domain ESD event.

Some aspects include a circuit having a second power clamp coupled to a second power rail and the second ground rail, wherein a second ESD path from the first PMOS transistor to the second power rail through the first NMOS transistor and the second power clamp is provided during the cross-domain ESD event. Certain aspects include a circuit having: a second NMOS transistor having a third source, a third drain, a third gate, and a body, wherein the body is coupled to the second ground rail, the third source is coupled to the second drain, the third drain is coupled to a second power rail, and the second NMOS transistor is turned on during the cross-domain ESD event; and a second PMOS transistor having a fourth source, a fourth drain, and a fourth gate, wherein the fourth source is coupled to the first ground rail, the fourth drain is coupled to the third gate, the fourth gate is coupled to the second ground rail, and a third ESD path from the first PMOS transistor to the second power rail through the second NMOS transistor is provided during the cross-domain ESD event.

Other aspects include a circuit having: a third NMOS transistor having a fifth source, a fifth drain, and a fifth gate, wherein the fifth source is coupled to the first source; and a third PMOS transistor having a sixth source, a sixth drain, and a sixth gate, wherein the sixth source is coupled to the second power rail, the sixth drain is coupled to the fifth drain, and the sixth gate is coupled to the second drain and the fifth gate, and wherein the first power clamp includes: a resistor coupled to the first power rail; a capacitor coupled to the resistor and the first ground rail; and an inverter having an input terminal coupled to the resistor and the capacitor, and an output terminal coupled to the first gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of ESD zapping, for instance, in a cross-domain interface circuit. The present disclosure addresses and solves such problems, for instance, by, inter alia, providing, via an I/O power clamp, a signal to turn on the ESD transistor when an ESD event occurs at a power rail coupled to the I/O power clamp, thereby preventing gate oxide breakdown of vulnerable transistors (e.g., that are coupled to the ESD transistor) in a cross-domain circuit.

Figure 1:
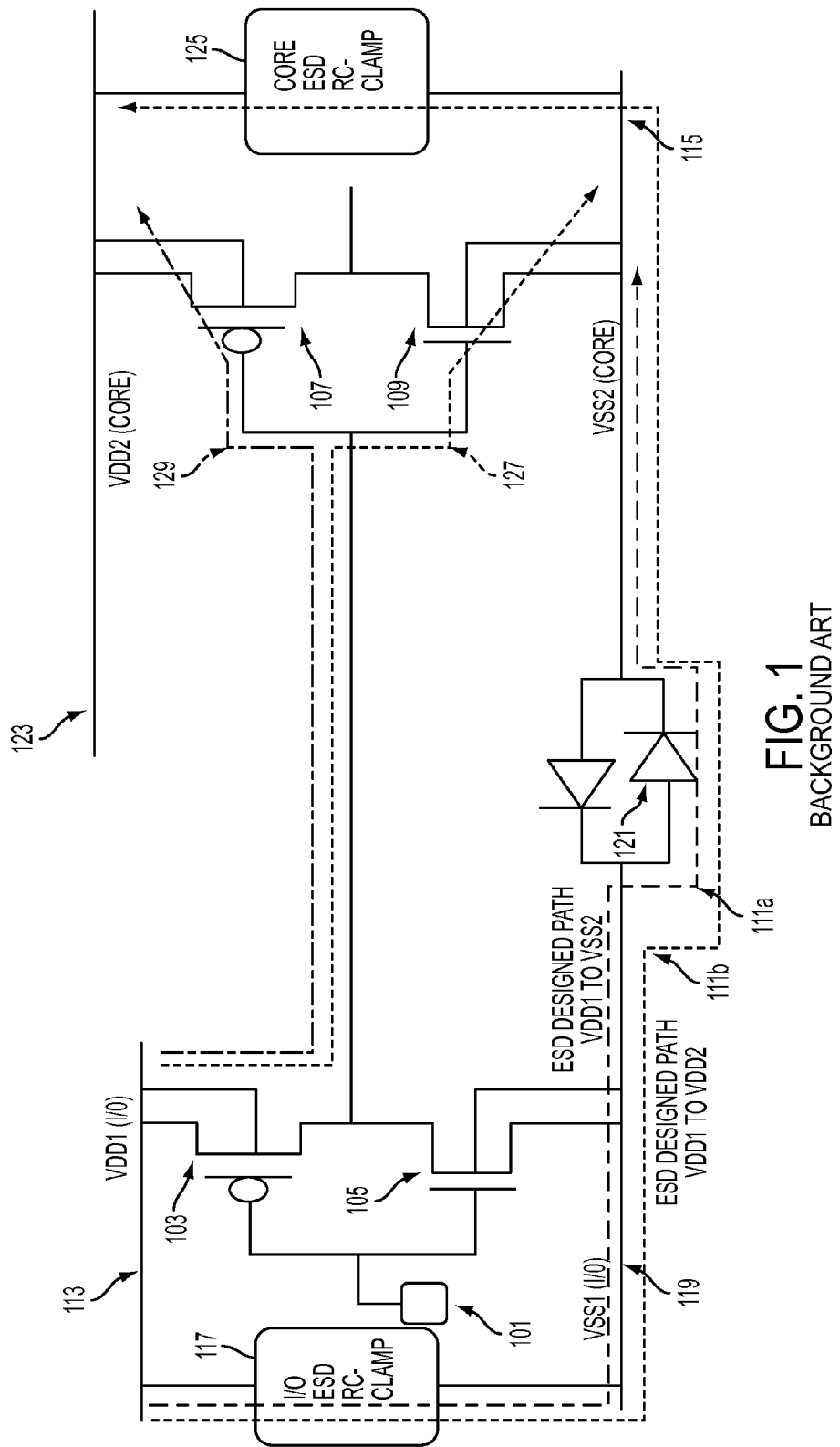
FIG. 1 schematically illustrates a circuit that includes a traditional cross-domain ESD protection scheme.
Figure 2:
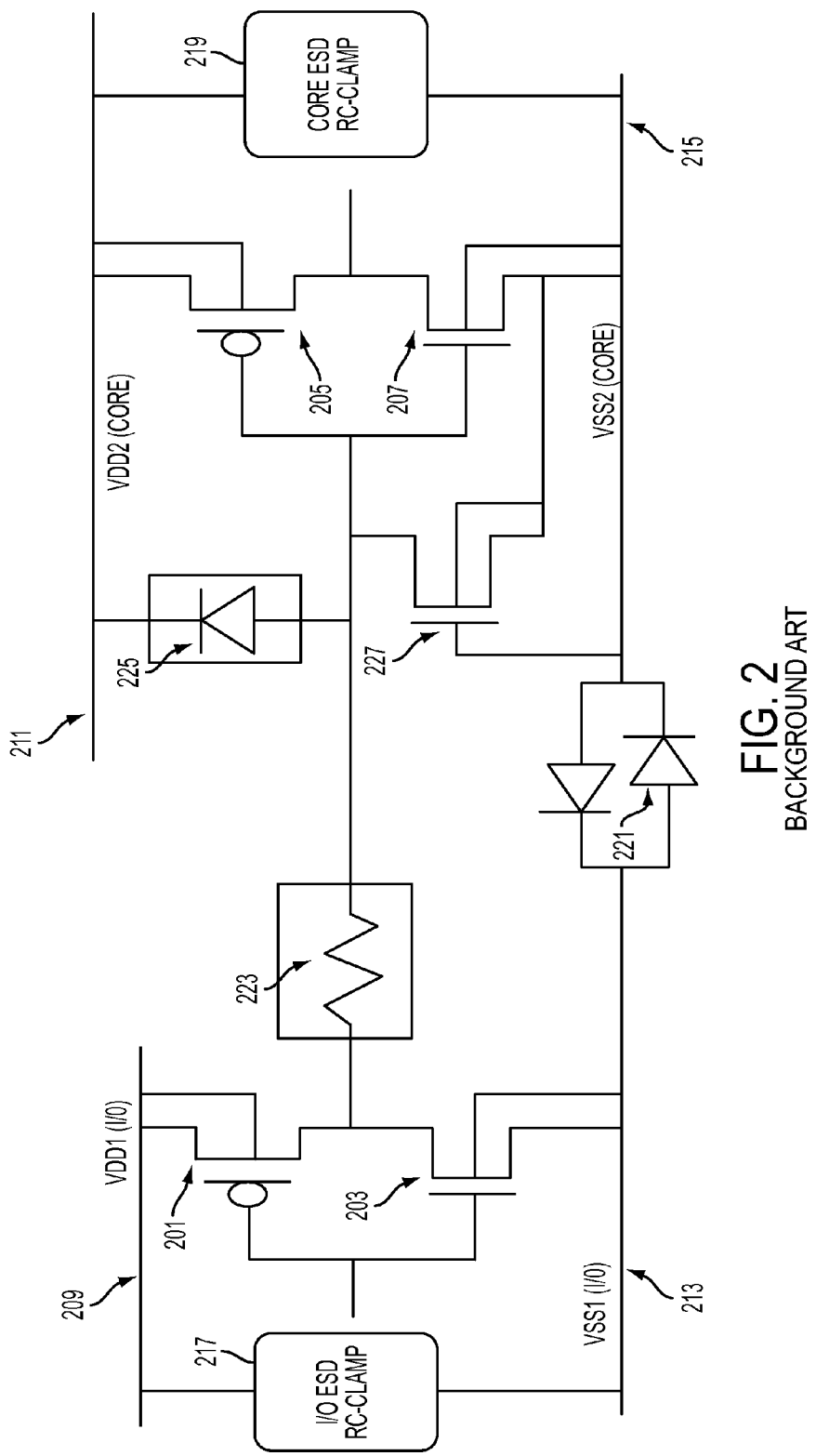
FIG. 2 schematically illustrates a typical solution for the problems of a traditional cross-domain ESD protection scheme.
Figure 3:
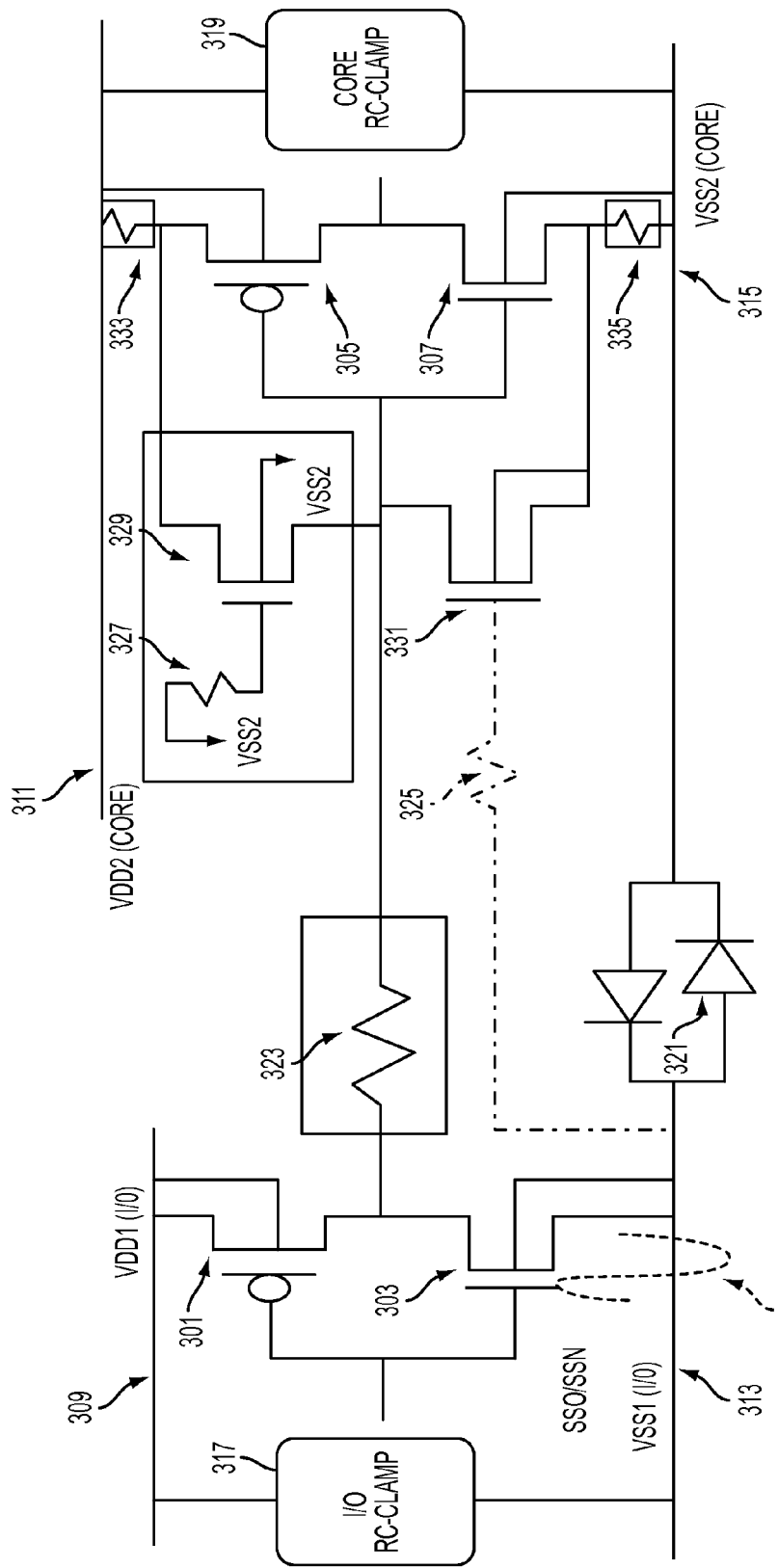
FIG. 3 schematically illustrates another solution for the problems of a traditional cross-domain ESD protection scheme.
Figure 4A:
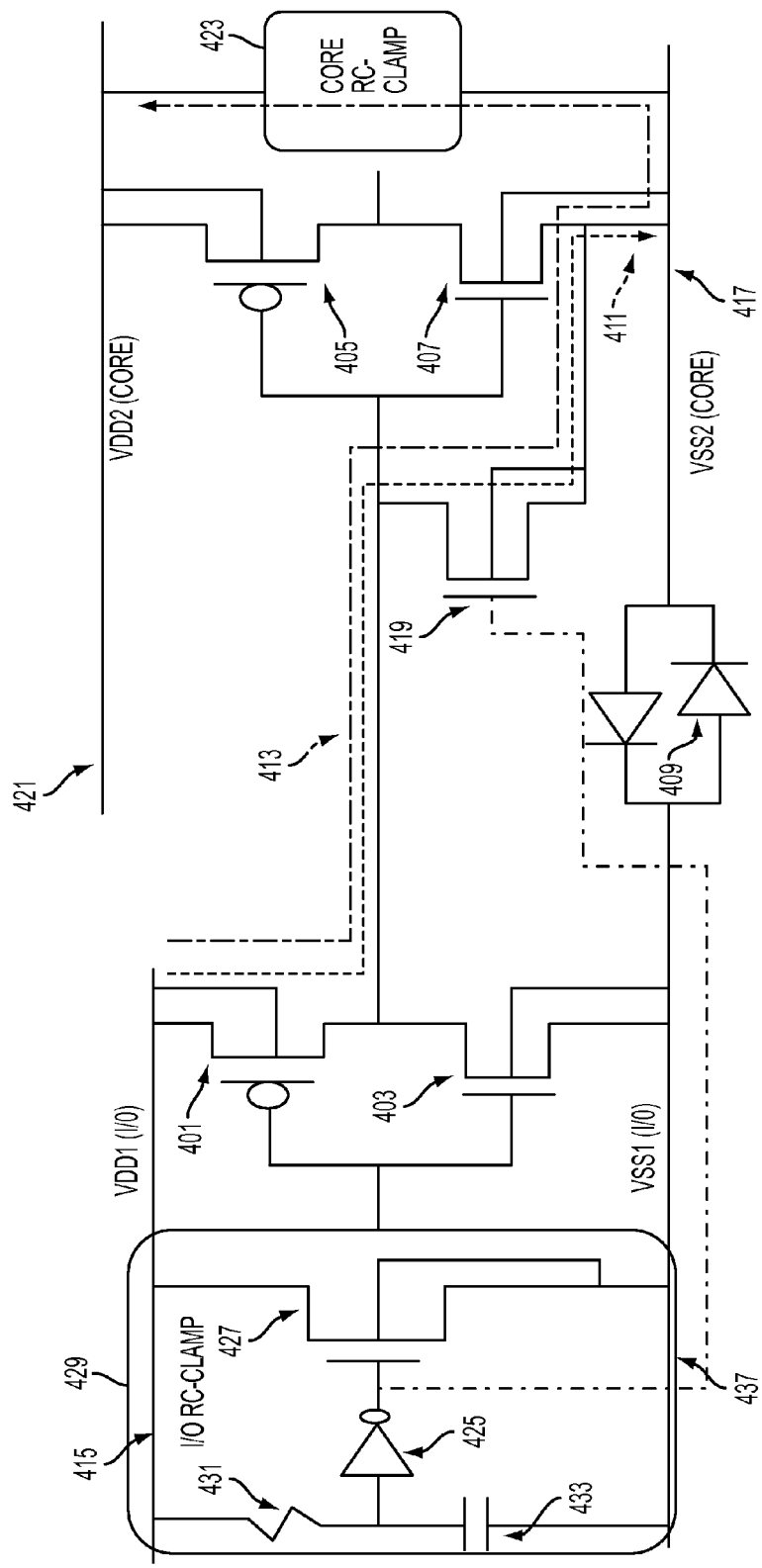
FIGS. 4A and 4B schematically illustrate circuits implementing cross-domain ESD protection schemes for advanced technologies, in accordance with an exemplary embodiment of the present disclosure.
Figure 4B:
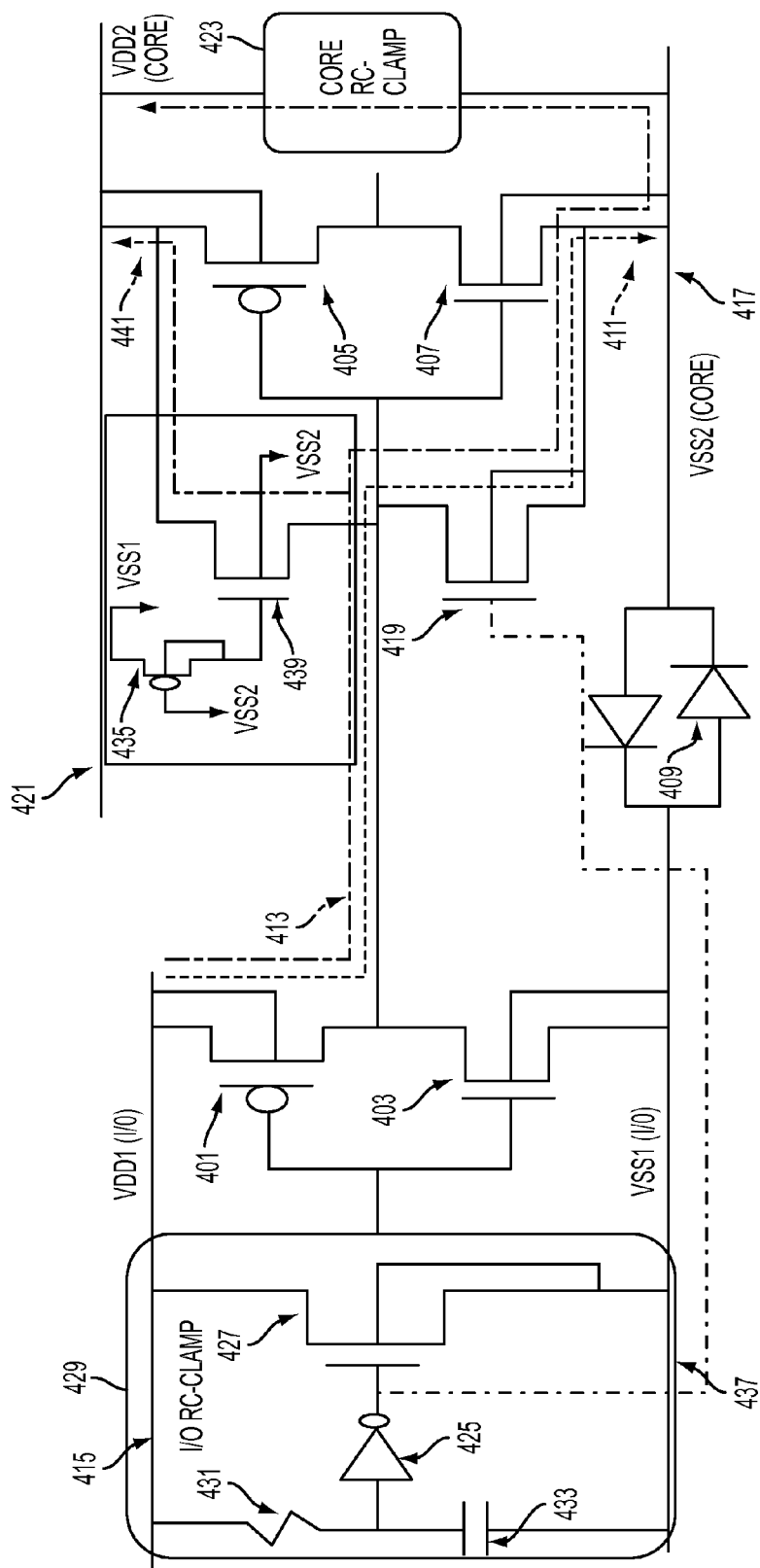

FIGS. 4A and 4B schematically illustrate circuits implementing cross-domain ESD protection schemes for advanced technologies, in accordance with an exemplary embodiment of the present disclosure. For example, the circuit shown in FIG. 4A (e.g., including transistors 401, 403, 405, and 407, and diodes 409, among other components, arranged similar to corresponding components of FIG. 1) implements paths 411 and 413. As shown, path 411 (e.g., from power rail 415 to ground rail 417) includes transistors 401 and 419, and path 413 (e.g., from power rail 415 to power rail 421) includes transistors 401 and 419, ground rail 417, and core clamp 423. For illustrative purposes, the following exemplary scenarios are provided:

Under cross-domain VDD1 to VSS2 ESD zapping, the purpose may, for instance, include preventing gate oxide breakdown of transistor 407. During the ESD event, ESD current from the ESD event will flow through one or more traditional design paths (e.g., design path 111a from FIG. 1). Moreover, path 411 will exist during the ESD event since transistor 419 is turned on due to the node between inverter 425 and transistor 427 inside I/O clamp 429 being "high" (e.g., as a result of the node between resistor 431 and capacitor 433 being "low"). Consequently, some of the ESD current from the ESD event will flow to ground rail 417 through path 411 to prevent damage to the gate oxide of transistor 407.

Under cross domain VDD1 to VDD2 ESD zapping, the purpose may, for instance, include preventing gate oxide breakdown of transistor 405. Like the above scenario, ESD current from the ESD event will flow through one or more traditional design paths (e.g., design path 111b from FIG. 1). Because transistor 419 is turned on during the ESD event (e.g., as a result of the node between inverter 425 and transistor 427 being "high"), path 413 will also be available as an ESD current path from power rail 415 to power rail 421. Thus, some of the ESD current will flow to power rail 421 through path 413 to prevent damage to the gate oxide of transistor 405.

The circuit shown in FIG. 4B further includes the structure having transistors 435 (e.g., PMOS transistor with its source coupled to ground rail 437 and its gate coupled to ground rail 417) and 439 (e.g., NMOS transistor with its body (or bulk) coupled to ground rail 417). As such, under cross domain VDD1 to VDD2 ESD zapping, path 441 is also available as an ESD current path from power rail 415 to power rail 421. Thus, some of the ESD current will also flow to power rail 421 through path 441, further mitigating the impact of the ESD current on transistor 405 and preventing damage to the gate oxide of transistor 405.

In addition to protecting the gate oxides of transistors 405 and 407, the ESD protection schemes of FIGS. 4A and 4B do not require a power-on sequence (e.g., there is no parasitic forward diode formation between the source of transistor 439 and power rail 421 since the body (or bulk) is tied to ground rail 417). There is also a significant size reduction in circuits that implement the ESD protection schemes of FIGS. 4A and 4B since extra resistors (e.g., resistors 323, 325, and 327, source pump resistors 333 and 335, etc.) that take up a significant amount of chip area are not necessary for these schemes. Moreover, as indicated, these schemes complement high-speed I/O applications (e.g., there are no source pump resistors 333 and 335 that reduce the speed of such applications). Furthermore, because the gate of transistor 419 is not coupled directly to ground rail 437, transistor 419 will not suffer false-triggering and, thus, the ESD protection schemes of FIGS. 4A and 4B will not experience distortion of the core output function as a result of a noisy I/O ground rail 437.

The embodiments of the present disclosure can achieve several technical effects, including gate oxide protection of vulnerable MOSFET transistors, high-speed I/O applications, design simplicity, reduced device (or circuit) size, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any device utilizing logic or high-voltage technology nodes. The present disclosure therefore enjoys industrial applicability in any of various types of highly integrated semiconductor devices, including devices that use ESD protection devices to pass ESD/Latch-up standards specifications (e.g., liquid crystal display (LCD) drivers, synchronous random access memories (SRAM), One Time Programming (OTP), power management products, etc.).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
    a first power clamp coupled to a first power rail and a first ground rail;
    a first NMOS transistor having a first source, a first drain, and a first gate, wherein the first source is coupled to a second ground rail;
    a first PMOS transistor having a second source, a second drain, and a second gate, wherein the second source is coupled to the first power rail, and the first power clamp provides a signal to turn on the first NMOS transistor during an ESD event that occurs at the first power rail;
    a second NMOS transistor having a third source, a third drain, a third gate, and a body, wherein the body is coupled to the second ground rail, and the second NMOS transistor is turned on during the ESD event; and
    a second PMOS transistor having a fourth source, a fourth drain, and a fourth gate,
    wherein the third source is coupled to the second drain, and the third drain is coupled to a second power rail, and the fourth source is coupled to the first ground rail, the fourth drain is coupled to the third gate, and the fourth gate is coupled to the second ground rail.

2. The circuit according to claim 1, wherein the first gate is coupled to the first power clamp, the second drain is coupled to the first drain, and an ESD path from the first PMOS transistor to the second ground rail through the first NMOS transistor is provided during the ESD event.

3. The circuit according to claim 1, further comprising:
    a second power clamp coupled to a second power rail and the second ground rail, wherein an ESD path from the first PMOS transistor to the second power rail through the first NMOS transistor and the second power clamp is provided during the ESD event.

4. The circuit according to claim 1, wherein an ESD path from the first PMOS transistor to the second power rail through the second NMOS transistor is provided during the ESD event.

5. The circuit according to claim 1, further comprising:
    a third NMOS transistor having a fifth source, a fifth drain, and a fifth gate, wherein the fifth source is coupled to the first source; and
    a third PMOS transistor having a sixth source, a sixth drain, and a sixth gate, wherein the sixth source is coupled to the second power rail, the sixth drain is coupled to the fifth drain, and the sixth gate is coupled to the second drain and the fifth gate.

6. The circuit according to claim 1, wherein the first power clamp includes:
    a resistor coupled to the first power rail;
    a capacitor coupled to the resistor and the first ground rail; and
    an inverter having an input terminal coupled to the resistor and the capacitor, and an output terminal coupled to the first gate.

7. A method comprising:
    coupling a first power clamp to a first power rail and a first ground rail;
    providing a first NMOS transistor having a first source, a first drain, and a first gate;
    coupling the first source to a second ground rail;
    providing a first PMOS transistor having a second source, a second drain, and a second gate;
    coupling the second source to the first power rail;
    providing, via the first power clamp, a signal to turn on the first NMOS transistor during an ESD event that occurs at the first power rail;
    providing a second NMOS transistor having a third source, a third drain, a third gate, and a body;
    coupling the body to the second ground rail, wherein the second NMOS transistor is turned on during the ESD event;
    coupling the third source to the second drain;
    coupling the third drain to a second power rail;
    providing a second PMOS transistor having a fourth source, a fourth drain, and a fourth gate;
    coupling the fourth source to the first ground rail;
    coupling the fourth drain to the third gate; and
    coupling the fourth gate to the second ground rail.

8. The method according to claim 7, further comprising:
    coupling the first gate to the first power clamp; and
    coupling the second drain to the first drain, wherein an ESD path from the first PMOS transistor to the second ground rail through the first NMOS transistor is provided during the ESD event.

9. The method according to claim 7, further comprising:
    coupling a second power clamp to a second power rail and the second ground rail, wherein an ESD path from the first PMOS transistor to the second power rail through the first NMOS transistor and the second power clamp is provided during the ESD event.

10. The method according to claim 7, wherein an ESD path from the first PMOS transistor to the second power rail through the second NMOS transistor is provided during the ESD event.

11. The method according to claim 7, further comprising:
    providing a third NMOS transistor having a fifth source, a fifth drain, and a fifth gate;
    coupling the fifth source to the first source;
    providing a third PMOS transistor having a sixth source, a sixth drain, and a sixth gate;
    coupling the sixth source to the second power rail;
    coupling the sixth drain to the fifth drain; and
    coupling the sixth gate to the second drain and the fifth gate.

12. The method according to claim 7, wherein the first power clamp is provided by:
    providing a resistor coupled to the first power rail;
    providing a capacitor coupled to the resistor and the first ground rail; and
    providing an inverter having an input terminal coupled to the resistor and the capacitor, and an output terminal coupled to the first gate.

13. A circuit comprising:

a first power clamp coupled to a first power rail and a first ground rail;

a first NMOS transistor having a first source, a first drain, and a first gate;

a first PMOS transistor having a second source, a second drain, and a second gate;

a second NMOS transistor having a third source, a third drain, a third gate, and a body; and a second PMOS transistor having a fourth source, a fourth drain, and a fourth gate, wherein the first source is coupled to a second ground rail, and the first gate is coupled to the first power clamp, the second source is coupled to the first power rail, and the second drain is coupled to the first drain, wherein the first power clamp provides a signal to turn on the first NMOS transistor during a cross-domain ESD event that occurs at the first power rail, and a first ESD path from the first PMOS transistor to the second ground rail through the first NMOS transistor is provided during the cross-domain ESD event, wherein the body is coupled to the second ground rail, the third source is coupled to the second drain, the third drain is coupled to a second power rail, and the second NMOS transistor is turned on during the cross-domain ESD event, and wherein the fourth source is coupled to the first ground rail, the fourth drain is coupled to the third gate, the fourth gate is coupled to the second ground rail, and a third ESD path from the first PMOS transistor to the second power rail through the second NMOS transistor is provided during the cross-domain ESD event.

14. The circuit according to claim 13, further comprising:

a second power clamp coupled to a second power rail and the second ground rail, wherein a second ESD path from the first PMOS transistor to the second power rail through the first NMOS transistor and the second power clamp is provided during the cross-domain ESD event.

15. The circuit according to claim 13, further comprising:

a third NMOS transistor having a fifth source, a fifth drain, and a fifth gate, wherein the fifth source is coupled to the first source; and a third PMOS transistor having a sixth source, a sixth drain, and a sixth gate, wherein the sixth source is coupled to the second power rail, the sixth drain is coupled to the fifth drain, and the sixth gate is coupled to the second drain and the fifth gate, and wherein the first power clamp includes: a resistor coupled to the first power rail; a capacitor coupled to the resistor and the first ground rail; and an inverter having an input terminal coupled to the resistor and the capacitor, and an output terminal coupled to the first gate.

* * * * *